United States Patent [19]

Shibata et al.

[11] 4,280,854
[45] Jul. 28, 1981

[54] METHOD OF MANUFACTURING A SEMICONDUCTOR DEVICE HAVING CONDUCTIVE AND INSULATING PORTIONS FORMED OF A COMMON MATERIAL UTILIZING SELECTIVE OXIDATION AND ANGLED ION-IMPLANTATION

[75] Inventors: Hiroshi Shibata; Hideo Iwasaki; Kunio Yamada, all of Kawasaki, Japan

[73] Assignee: VLSI Technology Research Association, Kawasaki, Japan

[21] Appl. No.: 34,901

[22] Filed: May 1, 1979

[30] Foreign Application Priority Data

May 4, 1978 [JP] Japan ................................. 53/52654

[51] Int. Cl.³ .................. H01L 21/265; H01L 21/285
[52] U.S. Cl. ..................................... 148/1.5; 29/571; 29/579; 148/174; 148/187; 148/188; 357/23; 357/59; 357/65; 357/91
[58] Field of Search ............... 148/174, 175, 187, 188, 148/1.5; 29/571, 577 R, 578, 591, 579; 357/23, 34, 59, 65, 91

[56] References Cited

U.S. PATENT DOCUMENTS

| | | | |
|---|---|---|---|
| 3,372,067 | 3/1968 | Schäfer | 148/188 X |
| 3,873,371 | 3/1975 | Wolf | 357/91 X |
| 4,030,942 | 6/1977 | Keenan et al. | 148/1.5 |
| 4,063,901 | 12/1977 | Shiba | 29/578 |
| 4,074,304 | 2/1978 | Shiba | 148/174 X |
| 4,084,986 | 4/1978 | Aoki et al. | 357/59 X |
| 4,085,499 | 4/1978 | Kuninobu et al. | 357/59 X |
| 4,086,694 | 5/1978 | Aung San U | 29/579 |
| 4,114,254 | 9/1978 | Aoki et al. | 357/59 X |

*Primary Examiner*—L. Dewayne Rutledge
*Assistant Examiner*—W. G. Saba
*Attorney, Agent, or Firm*—Hopgood, Calimafde, Kalil, Blaustein & Judlowe

[57] ABSTRACT

A semiconductor device is manufactured by covering a semiconductor substrate of a predetermined conductivity type with a polycrystal layer of a semiconductor material. Selected portions of the polycrystal layer are oxidized into an insulating material during heat treatment. Remaining portions of the polycrystal layer which are left unoxidized act as conductive portions. On manufacturing a bipolar transistor, ion implantation is carried out in a predetermined solid angle to introduce an impurity of an opposite conductivity selectively in a preselected one of the remaining portions. During the heat treatment, the impurity diffuses into the substrate only from the preselected portion to form a PN junction in the substrate. For fabricating an MOS transistor, an oxide film is preliminarily formed on the substrate selectively on an area on which a predetermined one of the remaining polycrystal layer portions is to be formed. Ion implantation is carried out to introduce an impurity of the opposite conductivity in the respective remaining layer portions. The oxide film prevents the impurity from diffusing to the substrate. The impurity diffuses into the substrate only from the respective remaining portions, except the predetermined portion.

2 Claims, 22 Drawing Figures

METHOD OF MANUFACTURING A SEMICONDUCTOR DEVICE HAVING CONDUCTIVE AND INSULATING PORTIONS FORMED OF A COMMON MATERIAL UTILIZING SELECTIVE OXIDATION AND ANGLED ION-IMPLANTATION

BACKGROUND OF THE INVENTION

This invention relates to a semiconductor device, such as a bipolar transistor or an MOS transistor, and a method of manufacturing the same.

A semiconductor device comprises a semiconductor substrate and at least one PN junction formed in the substrate between a pair of semiconductor regions of different conductivity types. The device further comprises electrodes and insulating layers on the substrate.

According to a conventional method of manufacturing a semiconductor device, several glass masks are successively formed on the substrate to form the semiconductor regions, the insulating layer or layers, and the electrodes in desired patterns as will later be described. The glass masks should have predetermined sizes and be in registration with successively defined areas. The use of many glass masks is disadvantageous because it is difficult to form the glass masks in precise sizes. The registration of the glass masks is troublesome and is inevitably accompanied by variations from the desired positions. Such being the case, the patterns of the semiconductor device have to be designed with a wide margin. When the electrodes are formed on the respective semiconductor regions and extended onto the insulating layers, a space has to be left between each pair of adjacent electrodes. It is a recent trend to manufacture a semiconductor device as a large scale integrated circuit, but for the foregoing reasons the semiconductor device is not suitable for large scale integration.

SUMMARY OF THE INVENTION

It is therefore an object of this invention to provide a method of manufacturing a semiconductor device, which can be carried out by using a reduced number of glass masks.

It is a further object of this invention to provide a semiconductor device which is suitable for large scale integration.

According to this invention, a method is provided for manufacturing a semiconductor device comprising a semiconductor substrate having a principal surface and a predetermined conductivity type with a first area selected on the principal surface and with a PN junction formed in the substrate to reach the first and to thereby define a second area in the first area with a remaining area left in the first area. The method comprises the steps of forming a layer of a conductive material on the principal surface to cover the remaining area and the second area, the material being oxidizable into an insulating material when heated, selectively forming a photoresist layer on the conductive layer with a first and a second portion of the conductive layer exposed, the first and the second conductive layer portions covering partial areas predetermined in the remaining area and the second areas, respectively, carrying out ion implantation to introduce an impurity selectively at least into the second conductive layer portion, forming a layer of a protective material on the photoresist layer and the first and the second conductive layer portions, the protective material preventing those portions of the conductive layer from being oxidized which are covered successively with the photoresist and the protective layers, removing the photoresist layer together with the protective layer portion formed thereon to uncover the conductive layer portions other than the first and the second conductive layer portions, heating the first, the second, and the uncovered conductive layer portions together with the substrate portions contiguous thereto to oxidize the uncovered portions into insulating layer portions and thereby making the impurity diffuse into the substrate to form the PN junction, and removing the protective layer remaining on the first and the second conductive layer portions.

DESCRIPTION OF THE PREFERRED EMBODIMENT

Figure 1A:
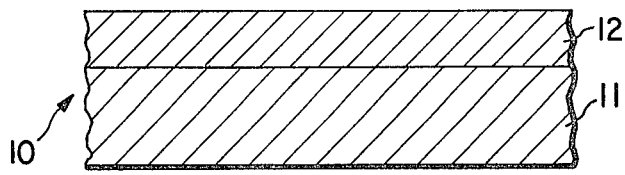
FIGS. 1(a) through 1(e) are diagrammatic cross-sectional views illustrating several steps of a conventional method of manufacturing a semiconductor device.
Figure 1B:
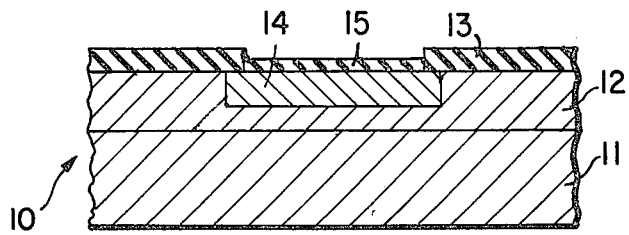
Figure 1C:
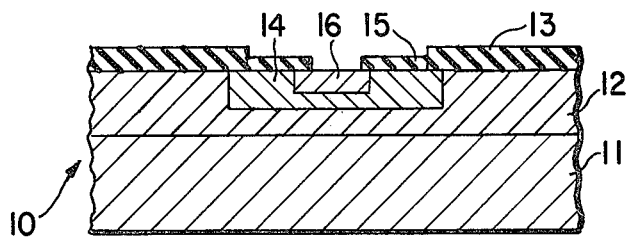
Figure 1D:
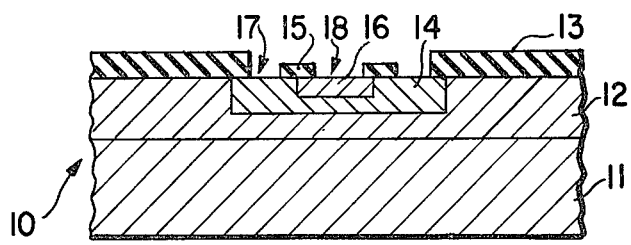
Figure 1E:
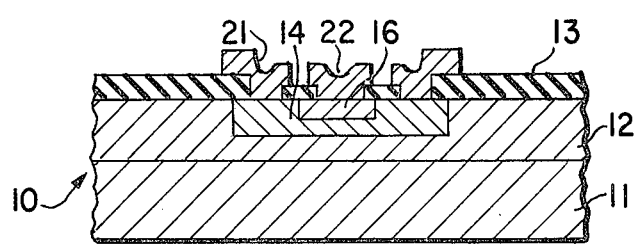

FIG. 1 illustrates the steps of a conventional method for fabricating a semiconductor device to facilitate an understanding of this invention. The method is for manufacturing a single bipolar transistor of an NPN type. In FIG. 1(a), a substrate 10 has a wafer 11 of $N^+$ type silicon and an epitaxial layer 12 of N type silicon grown on the wafer 11 by the use of the epitaxial growth technique. The substrate 10 serves as a collector of the NPN transistor. In FIG. 1(b), the substrate 10 is oxidized to form a first film 13 of silicon dioxide on a whole surface of the epitaxial layer 12. In this state, a principal surface is provided between the epitaxial layer 12 and the first film 13. The first film 13 is selectively photoetched with the help of a first glass mask (not shown) to form a window in which the epitaxial layer 12 is partially exposed. An impurity of P conductivity type, such as boron, is introduced through the window into the epitaxial layer 12 by ion implantation or thermal diffusion to form a first region 14 of P conductivity type. The first region 14 defines a first area on the principal surface with a peripheral portion covered by the first film 13. A second film 15 of silicon dioxide is formed within the window as shown in FIG. 1(b). In FIG. 1(c), the second film 15 is partially photoetched by the use of a second glass mask (not shown) to partially expose the first region 14. Thereafter, an impurity of N conductivity type, such as phosphorus or arsenic, is introduced by ion implantation or thermal diffusion to form a second region 16 of N conductivity type. A PN junction is formed between the first and second regions 14 and 16. The PN junction reaches the first area and, as a result, defines a second area in the first area with a remaining area left in the first area. The first and second regions 14 and 16 serve as a base and an emitter of the NPN transistor. Although not shown in these figures, an oxide film is actually formed on the exposed second region again after the introduction of the impurity. In FIG. 1(d), the second film 15 is selectively photoetched with a third glass mask (not shown) to form contact holes 17 and 18 for the base and the emitter. In other words, the PN junction between regions 14 and 16 is covered by the second film 15 partially remaining on the principal surface of the epitaxial layer 12. Subsequently, a conductive layer of a metal such as aluminum is deposited by vacuum evaporation and, thereafter, is thereafter selectively photoetched by the use of a fourth glass mask (not shown) to leave first and second electrodes 21 and 22 attached to the first and second regions 14 and 16, respectively, as shown in FIG. 1(e). The first and second electrodes 21 and 22 are extended onto the first and second films 13 and 15 with a space of at least one micron left between each pair of adjacent electrodes. As mentioned above, this method necessitates the use of the first through fourth glass masks which results in the various disadvantages pointed out previously in this specification. In addition, the space between the electrodes is obstructive to a compact design of the semiconductor device.

Referring now to FIG. 2, a description is provided of a method of manufacturing a semiconductor device according to a first embodiment of this invention. As in the conventional method of FIG. 2, illustrated with reference to FIG. 1, the method is illustrated for use in manufacturing a single bipolar transistor of an NPN type. In FIG. 2(a), a substrate 10 has a wafer 11 of N+ type silicon and an epitaxial layer 12 grown on the wafer 11. In the method illustrated in FIG. 2, the wafer 11 has an impurity density of about $10^{22}$ cm$^{-3}$ and a thickness of about 400 microns while the epitaxial layer 12 has an impurity density of about $10^{16}$ cm$^{-3}$ and a thickness of five microns. The substrate 10 serves as a collector of the NPN transistor. In FIG. 2(b), a silicon dioxide film 13 is formed to a thickness of about 3000 Å on the surface of the epitaxial layer 12 and is thereafter selectively photoetched by the use of a first glass mask (not shown) to partially expose the epitaxial layer surface. A principal surface is defined on the epitaxial layer surface. An impurity of P conductivity type, such as boron, is introduced into the epitaxial layer 12 through the partially exposed surface by means of thermal diffusion or ion implantation to form a first region 14 of P conductivity type. In the example illustrated in FIG. 2, the first region 14 has a thickness of about 0.35 microns and an impurity dose between $5 \times 10^{13}$ cm$^{-2}$ and $5 \times 10^{15}$ cm$^{-2}$. From FIG. 2(b), it is readily understood that the first region 14 provides a first area selected on the principal surface. In FIG. 2(c), a polysilicon layer 25 of about 3000 Å in thickness is deposited on the exposed first region 14 and the silicon dioxide film 13. The polysilicon layer 25 is formed at a temperature between 700° C. and 1000° C. The polysilicon layer 25 acts as a conductive material unless it is oxidized. To reduce the resistance of the polysilicon layer 25, an impurity of P conductivity type, such as boron, is introduced into the polysilicon layer 25 by thermal diffusion or ion implantation. In the example illustrated, sheet resistance of the polysilicon layer 25 is between 100 and 10000 Ω/□. In FIG. 2(d), a photoresist layer 26 of a preselected thickness h is selectively formed on the polysilicon layer 25 with two first portions 27 and one second portion 28 of the polysilicon layer 25 exposed. Practically, the two first portions 27 are contiguous to each other and are separated from the first portion 28 by the photoresist layer 26 left therebetween. From FIG. 2(d), it is understood that the two first portions 27 are narrower in width than the second portion 28. For convenience of description, it is surmised that the widths of the two first portions 27 are Wa$_1$ and Wa$_2$, whereas that of the second portion 28 is Wb$_1$. In FIG. 2(e), ion implantation is carried out with a first and a second angle $\theta$ and $\theta'$ of ion implantation selected in consideration of the thickness h, the two first widths Wa$_1$ and Wa$_2$, and the second width Wb$_1$, for selectively introducing an impurity of N conductivity type, such as arsenic or phosphorus, into only the second portion 28 of the polysilicon layer 25. As shown in FIG. 2(e), the first and the second angles $\theta$ and $\theta'$ are inclined to the surface of the polysilicon layer 25. In order that the impurity is introduced into only the second polysilicon layer portion 28, the first and the second angles $\theta$ and $\theta'$ are selected as follows;

$\theta < \tan^{-1} Wa_1/h$ and $\theta' < \tan^{-1} Wa_2/h$.

Figure 2A:
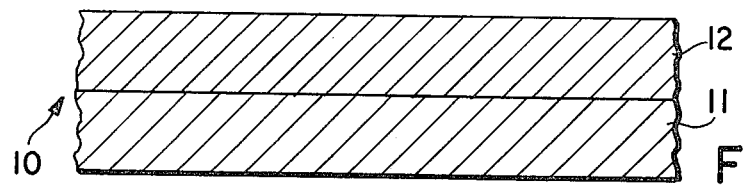
FIGS. 2(a) through 2(i) are cross-sectional views illustrating various steps of a method for fabricating a semiconductor device according to a first embodiment of this invention.
Figure 2B:
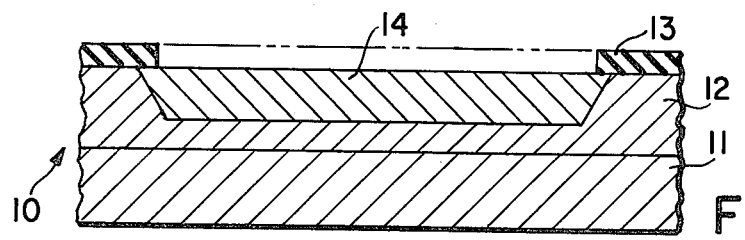
Figure 2C:
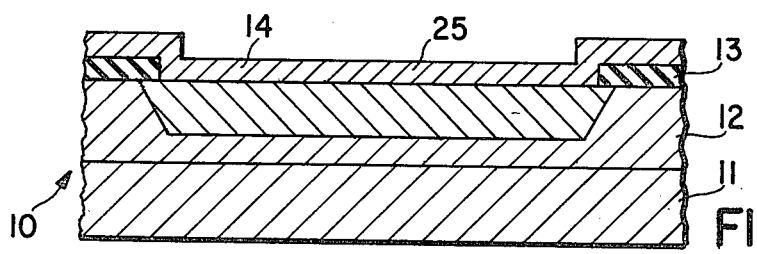
Figure 2D:
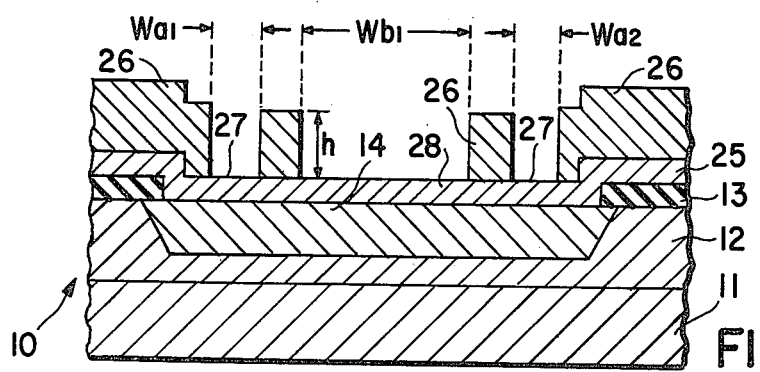
Figure 2E:
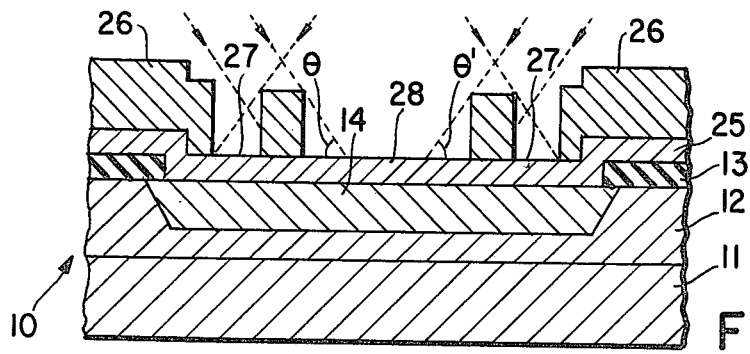
Figure 2F:
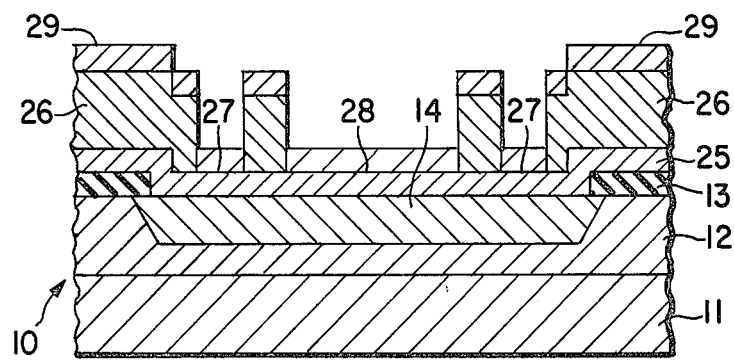
Figure 2G:
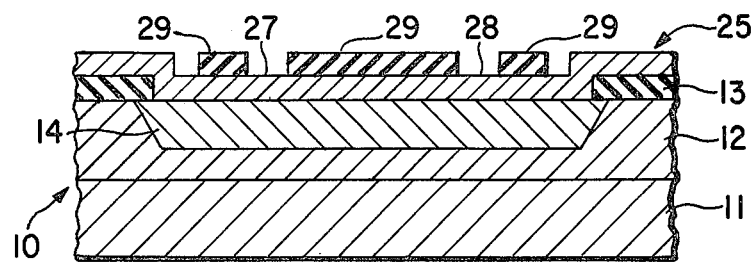
Figure 2H:
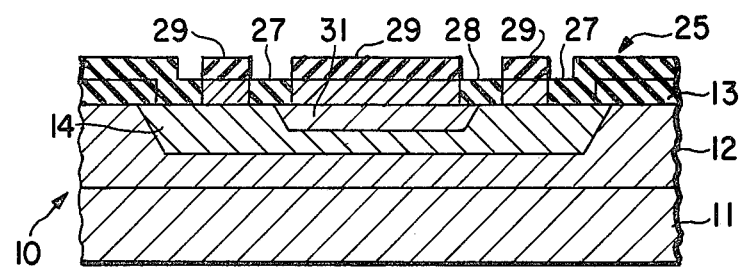
Figure 2I:
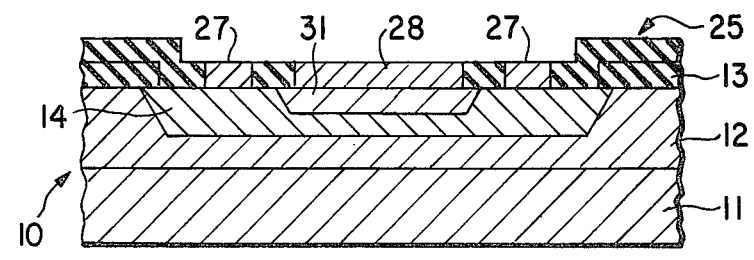
Figure 3A:
FIGS. 3(a) through 3(h) similarly show the steps of a method for fabricating a semiconductor device according to a second embodiment of this invention.
Figure 3E:
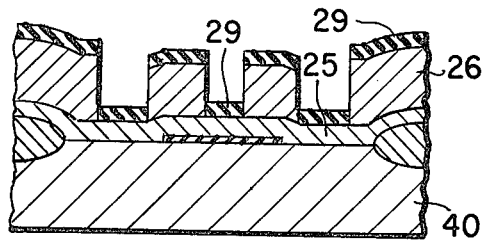
Figure 3B:
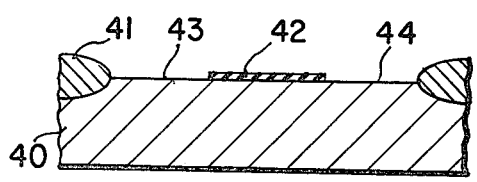
Figure 3F:
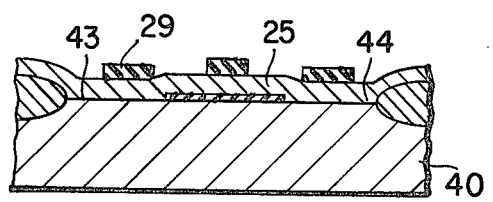
Figure 3C:
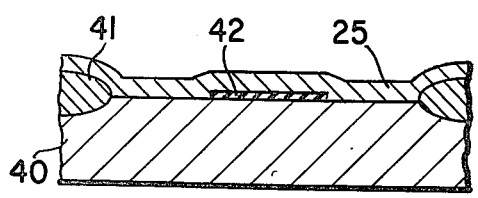
Figure 3G:
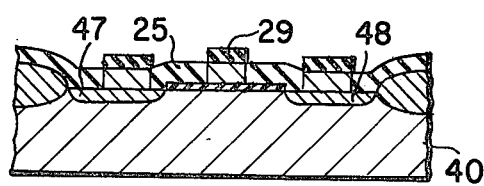
Figure 3D:
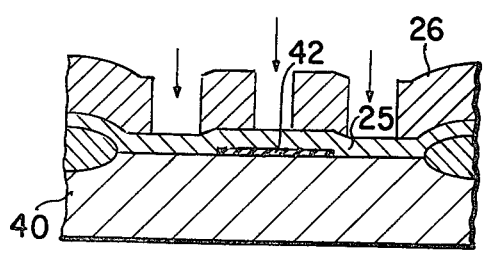
Figure 3H:
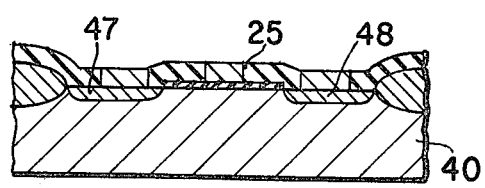

The ion implantation from the first and the second angles $\theta$ and $\theta'$ enables the impurity to be introduced into a whole of the second polysilicon layer portion 28. The impurity, however, does not reach the two first polysilicon layer portions 27 because the photoresist layer 26 serves as a barrier against the ion implantation and the first polysilicon layer portions 27 lie in the shades of the photoresist layer 26. In the example illustrated, the widths Wa$_1$ and Wa$_2$ of the two first portions 27 and the width Wb$_1$ of the second portion 28 are equal to two and five microns, respectively, and the thickness h of the photoresist layer 26, is equal to three microns. In this case, the ion implantation is carried out with each of the first and the second angles $\theta$ and $\theta'$ equal to 45° when the first and the second angles $\theta$ and $\theta'$ are represented by acute angles. From FIG. 2(e), it is understood that parallelism of an ion beam of the impurity should be strictly maintained on the ion implantation. In addition, no damage takes place on the substrate due to the ion implantation because no ion beam is directly incident to the substrate 10. In FIG. 2(f), a silicon nitride layer 29 of about 3000 Å is deposited on the photoresist layer of 26 and on the first and second polysilicon layer portions 27 and 28 to protect the first and the second portions 27 and 28 from being oxidized. The silicon nitride layer 29 should be deposited at such a temperature that no thermal deformation occurs in the photoresist layer 26, because the photoresist layer 26 deforming at about 150° C. remains on the polysilicon layer 25. Preferably, use is made of plasma chemical vapor deposition or sputtering. In FIG. 2(g), the photoresist layer 26 is removed together with the silicon nitride film 29 deposited thereon by the so called lift off technique. As a result, a wafer assembly if formed with the silicon nitride film 29 left on the first and the second portions 27 and 28. In this state, the wafer assembly is heat-treated at a temperature of 950° C. in an oxygen atmosphere. During the heat treatment, the polysilicon layer 25 is selectively oxidized into an insulating layer of silicon dioxide with the first and the second portions 27 and 28 remaining in unoxidized states. Consequently, the first and the second portions 27 and 28 are insulated by the insulating layer between them. Preferably, the insulating layer is 1 micron wide. Subsequently, the assembly is further heat-treated at a temperature of about 1050° C., which is that of the prior heat treatment. In FIG. 2(h), an impurity of N conductivity type is thermally diffused into the first region 14 to form a second region 31 of N conductivity type and, as a result, to form a PN junction between the first and the second regions 14 and 31. The second region 31 has a thickness of about 0.18 microns and an impurity density of $5\times10^{15}$ cm$^{-3}$. As shown in FIG. 2(h), the second region 31 is contiguous to the principal surface to define a second area within the first area. Therefore, the first area is divided into the second area and a remaining area left in the first area. The first and the second regions 14 and 31 respectively serve as the base and the emitter of the NPN transistor. After the heat treatments are finished, the silicon nitride film 29 is thoroughly removed by the use of a chemical etchant, such as HF, or by a plasma technique to complete the NPN transistor, as shown in FIG. 2(i). The silicon nitride film 29 may be partially removed. It will be understood from FIG. 2(i) that the first and the second polysilicon layer portions 27 and 28 are not oxidized and, as a result, as a base and an emitter electrode, respectively. Therefore, the first and the second polysilicon layer portions 27 and 28 should be selected at portions which partially cover the remaining area of the first area and the second area for the base and the emitter, respectively. Ohmic contacts are readily formed on the first region 14 by the heat treatment because the impurity of the P conductivity type of impurity is included in the polysilicon layer 25, as illustrated with reference to FIG. 2(c).

The method according to the first embodiment of the invention is capable of manufacturing a bipolar transistor with the use of only two glass masks. Mask registration is, therefore, required only one time in this method. In other words, the bipolar transistor is manufactured simply and in precise sizes.

The base electrode of the the bipolar transistor fabricated by the method according to the first embodiment of this invention may be made remarkably thin. This permits a reduction in the area occupied by the first or base region which results in a small junction capacitance between the collector and the base. As a result, the bipolar transistor made by this method has an improved high-frequency characteristic.

In the example illustrated with reference to FIG. 2, polysilicon is used as a conductive layer. This means that the conductive layer is made from a material common to the substrate. For example, when the substrate is of a material such as GaAs or InSb, its polycrystal is used as the conductive layer.

FIG. 3, illustrates steps of a method of manufacturing an MOS transistor according to a second embodiment of this invention. In FIG. 3a, a substrate 40 of N conductivity type has, on its surface, a thick film 41 of a thickness of about 3000 Å with a first area selectively exposed. The thick film 41 may be of silicon dioxide. In FIG. 3(b), the first area is selectively covered with a thin film 42 of silicon dioxide of a thickness of about 1000 Å to divide the first area into two first area portions 43 and 44 with a third area portion covered by the thin film 42 left between the two first area portions 43 and 44. The two first area portions 43 and 44 and the surface of the thin film 42 provide a principal surface. In FIG. 3(c), a polysilicon layer 25 is formed on the two first area portions 43 and 44, the thin film 42, and the thick film 41. The polysilicon layer 25 is about 3000 Å thick. In FIG. 3(d), a photoresist layer 26 is selectively covered on the polysilicon layer 25 with partial areas uncovered. The respective uncovered areas of the polysilicon layer 25 partially cover the two first area portions 43 and 44 and the surface of the thin film 42. In this state, ion implantation is carried out perpendicularly to the principal surface to introduce an impurity of P conductivity type such as boron into the uncovered areas of the polysilicon layer 25. In FIG. 3(e), a silicon nitride film 29 is formed on the photoresist layer 26 and the polysilicon layer 25. As shown in FIG. 3(f), the photoresist layer 26 is removed together with the silicon nitride film 29 thereon in a well-known manner. As a result, the silicon nitride film 29 left on the polysilicon layer 25 partially covers the two first areas 43 and 44 and the surface of the thin film 42. In FIG. 3(g), the polysilicon layer 25 is oxidized to form an insulating layer of silicon dioxide with unoxidized regions remaining therein. A heat treatment is carried out to make the impurity in the polysilicon layer 25 diffuse in the substrate 40 and to thereby form a PN junction. At this time, the impurity is introduced into the two first area portions 43 and 44 to form a pair of semiconductor regions 47 and 48 of P conductivity type. Each of the semiconductor regions 47 and 48 is slightly extended from the two first area portions 43 and 44 to the underlying surface of the thin film 42. On the other hand, the thin film 42 serves as a protection film against diffusion of the impurity. Accordingly, no impurity is introduced through the thin film 42. A second area is defined on the first area between the semiconductor regions 47 and 48. In FIG. 3(h), the silicon nitride film 29 is removed in the usual manner. The respective semiconductor regions 47 and 48 serve as a drain and a source of the MOS transistor whereas the polysilicon layer 25, which is unoxidized, serves as the electrodes for the drain and the source. From FIG. 3(h), it is understood that the PN junction is formed in that portion of the substrate 40 which is adjacent to each of the two first area portions 43 and 44.

The semiconductor device fabricated by the method of this invention has electrodes of a semiconductive material which are insulated from each other by oxide layers of the common semiconductive material. This makes contact holes unnecessary for the respective electrodes. Therefore, a reduction is possible of the widths of the respective electrodes.

What is claimed is:

1. A method of manufacturing a semiconductor device comprising a semiconductor substrate having a principal surface and a predetermined conductivity type, said method comprising the steps of:

selectively forming, in said substrate, a first semiconductor region reaching said principal surface, said first semiconductor region being of the conductivity type opposite to said predetermined conductivity type to define a first PN junction in said substrate;

forming a layer of a conductive material on said principal surface to cover said first semiconductor region, said material being oxidizable into an insulating material when heated;

selectively forming a photoresist layer on said conductive layer to a predetermined thickness with a first and a second portion of said conductive layer exposed over said first semiconductor region, said first and said second conductive layer portions having a first width and a second width wider than said first width, respectively, said second conductive layer portion being placed inside said first conductive layer portion with the photoresist layer left therebetween;

carrying out ion implantation to introduce an impurity of the predetermined conductivity type substantially only on said second conductive layer portion at a first and a second angle to said principal surface, said first and said second angles being selected in consideration of said predetermined thickness and said first and said second widths;

forming a layer of a protective material on said photoresist layer and said first and said second conductive layer portions, said protective material preventing those portions of said conductive layer placed on said first and said second conductive layer portions, respectively, from being oxidized;

removing said photoresist layer together with the protective layer portion formed thereon to expose the conductive layer portions other than said first and said second conductive layer portions;

forming a second semiconductor region of the predetermined conductivity type in said first semiconductor region by making said impurity diffuse from said second conductive layer portion while said exposed portions are oxidized into insulating layer portions, said second semiconductor region providing a second PN junction in said first semiconductor region; and removing the protective layer remaining on said first and said second conductive layer portions.

2. A method as claimed in claim 1, wherein said predetermined thickness is about three microns, said first and said second widths being about two and five microns, respectively, each of said first and said second angles being about 45° when said first and said second angles are represented by acute angles.

* * * * *